US007765693B2

(12) United States Patent
Brodsky et al.

(10) Patent No.: US 7,765,693 B2
(45) Date of Patent: Aug. 3, 2010

(54) ELECTRICALLY CONNECTING TWO SUBSTRATES USING A RESILIENT WIRE BUNDLE CAPTURED IN AN APERTURE OF AN INTERPOSER BY A RETENTION MEMBER

(75) Inventors: William Louis Brodsky, Binghamption, NY (US); John Lee Colbert, Byron, MN (US); Roger Duane Hamilton, Rochester, MN (US); Amanda Elisa Ennis Mikhail, Rochester, MN (US); Mark David Plucinski, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/183,288

(22) Filed: Jul. 31, 2008

(65) Prior Publication Data

US 2008/0282539 A1 Nov. 20, 2008

Related U.S. Application Data

(62) Division of application No. 11/760,925, filed on Jun. 11, 2007, now abandoned.

(51) Int. Cl.
*H01R 43/00* (2006.01)
*H05K 13/00* (2006.01)

(52) U.S. Cl. ......................... 29/854; 229/874; 229/876; 229/830; 324/754; 324/758

(58) Field of Classification Search ................... 29/854, 29/830, 832, 837, 846; 324/754
See application file for complete search history.

(56) References Cited

U.S. PATENT DOCUMENTS

| | | | | |
|---|---|---|---|---|
| 4,290,195 A * | 9/1981 | Rippere | 29/837 |
| 4,574,331 A | 3/1986 | Smolley | |
| 4,581,679 A | 4/1986 | Smolley | |
| 4,999,023 A | 3/1991 | Froloff | |
| 5,552,752 A | 9/1996 | Sturdivant et al. | |
| 5,672,062 A * | 9/1997 | Lindeman | 439/66 |
| 5,704,794 A | 1/1998 | Lindeman | |

(Continued)

FOREIGN PATENT DOCUMENTS

EP 0248521 A2 12/1987

(Continued)

*Primary Examiner*—Derris H Banks
*Assistant Examiner*—Jeffrey Carley
(74) *Attorney, Agent, or Firm*—Matthew J. Bussan

(57) ABSTRACT

A method and apparatus for electrically connecting two substrates using resilient wire bundles captured in apertures of an interposer by a retention film. The interposer comprises an electrically non-conductive carrier having two surfaces and apertures extending from surface to surface. A resilient wire bundle is disposed in each aperture. An electrically non-conductive retention film is associated with one or both surfaces of the carrier and has an orifice overlying each aperture. The width of each orifice is smaller than that of the underlying aperture to thereby enhance retention of the resilient wire bundle within the aperture. Pin contacts of one or both of the substrates make electrical contact with the resilient wire bundles by extending through the orifices of the retention film and partially through the apertures. In one embodiment, the interposer is a land grid array (LGA) connector that connects an electronic module and a printed circuit board (PCB).

14 Claims, 7 Drawing Sheets

U.S. PATENT DOCUMENTS

| | | | | | |
|---|---|---|---|---|---|
| 6,062,870 | A * | 5/2000 | Hopfer et al. | ................. | 439/66 |
| 6,386,890 | B1 | 5/2002 | Bhatt et al. | | |
| 6,695,623 | B2 | 2/2004 | Brodsky et al. | | |
| 6,756,797 | B2 * | 6/2004 | Brandorff et al. | ........... | 324/754 |
| 2002/0072152 | A1 * | 6/2002 | Urushima | ................... | 438/108 |
| 2004/0002233 | A1 * | 1/2004 | Advocate et al. | .............. | 439/66 |
| 2006/0066331 | A1 * | 3/2006 | Yoshida et al. | .............. | 324/754 |

FOREIGN PATENT DOCUMENTS

| | | | |
|---|---|---|---|
| JP | 2005-114547 | * | 4/2005 |

* cited by examiner

ELECTRICALLY CONNECTING TWO SUBSTRATES USING A RESILIENT WIRE BUNDLE CAPTURED IN AN APERTURE OF AN INTERPOSER BY A RETENTION MEMBER

CROSS-REFERENCE TO RELATED APPLICATION

This patent application is a divisional application of U.S. patent application Ser. No. 11/760,925, filed Jun. 11, 2007, entitled "ELECTRICALLY CONNECTING TWO SUBSTRATES USING A RESILIENT WIRE BUNDLE CAPTURED IN AN APERTURE OF AN INTERPOSER BY A RETENTION MEMBER", which is a divisional application of U.S. patent application Ser. No. 11/297,307, filed Dec. 8, 2005, entitled "METHOD AND APPARATUS FOR ELECTRICALLY CONNECTING TWO SUBSTRATES USING A RESILIENT WIRE BUNDLE CAPTURED IN AN APERTURE OF AN INTERPOSER BY A RETENTION MEMBER", each of which is hereby incorporated by reference.

BACKGROUND OF THE INVENTION

1. Field of Invention

The present invention relates in general to the electrical connector field. More particularly, the present invention relates to the assembly of electrical connectors incorporating an interposer having a resilient wire bundle that provides a conductive path between two substrates and that is captured within an aperture of the interposer by a retention member. The present invention also relates to apparatus involved in the assembly of such electrical connectors.

2. Background Art

Electrical connectors are in widespread use in the electronics industry. In many computer and other electronic circuit structures, an electronic module such as a central processor unit (CPU), memory module, application-specific integrated circuit (ASIC) or other integrated circuit, must be connected to a printed circuit board (PCB). In connecting an electronic module to a PCB, a plurality of individual electrical contacts on the base of the electronic module must be connected to a plurality of corresponding individual electrical contacts on the PCB. This set of contacts on the PCB dedicated to contacting the electronic module contacts is known as a land grid array (LGA) site. Rather than permanently soldering the electronic module contacts to the LGA site, it is desirable to use LGA connectors that allow the electronic module to be installed to and removed from the LGA site. LGA connectors are also known as sockets, interconnects, interposers, carriers, and button board assemblies.

LGA connectors provide the user with the flexibility to upgrade or replace electronic modules during the manufacturing cycle and in the field. A trend in the electronics industry has been to increase both the quantity LGA sites and the density of each LGA site, i.e., the number of contacts per unit area at the LGA site. Another trend in the electronics industry is to reduce the rated insertion force necessary to insert the electronic module into the LGA connector.

One type of LGA connector that has proven to be very reliable incorporates resilient wire bundles. Electrical connectors having resilient wire bundles for providing conductive paths between two electronic substrates, i.e., an electronic module and a PCB, are well known to those skilled in the art. Such resilient wire bundles are also well known as wadded wire, fuzz buttons, button contacts, button wads, or contact wads, which are collectively referred to hereafter as resilient wire bundles.

For example, U.S. Pat. No. 6,062,870 to Hopfer, III et al., the disclosure of which is incorporated by reference herein, discloses an electrical interconnect that incorporates resilient wire bundles that are retained in holes of a carrier by compressive frictional engagement with a central section of the side wall of each of the holes. In use, the carrier is placed between two circuit boards and the resilient wire bundles provide conductive paths between the two circuit boards.

A well known problem with electrical connectors that incorporate resilient wire bundles is that one or more of the resilient wire bundles may be jarred loose and fall out from the interposer during transit or handling. If a resilient wire bundle is missing from the interposer, an open circuit will result when the interposer is used to connect two electronic substrates. In this case, the interposer that is missing the resilient wire bundle must be replaced for the two electronic substrates to be properly connected. Such opens occur notwithstanding the teachings of Hopfer, III et al. that the resilient wire bundles are force fitted into holes in the interposer. In a related problem, instead of being jarred completely out of the interposer, the resilient wire bundle is instead jarred partially loose from the interposer such that when the resilient wire bundle is compressed between the two electronic substrates, the resilient wire bundle bends over and makes contact with an adjacent resilient wire bundle or an adjacent contact on the electronic substrate. If a bent-over resilient wire bundle makes such an inadvertent contact, a short circuit will result. Such a short can catastrophically damage to one or both of the electronic substrates being interconnected. Accordingly, the interposer that contains the bent-over resilient wire bundle, and possibly also one or both of the electronic substrates being interconnected, would have to be replaced.

These problems are recognized in U.S. Patent Application Publication No. 2004/0002233 A1 to Advocate, Jr. et al., the disclosure of which is incorporated by reference herein, which discloses a method of assembling an interconnect device assembly which consists of cylindrical resilient wire bundles captured with a carrier. The interconnect device assembly is placed in a fixture and the ends of the resilient wire bundles are deformed by shaping dies in the fixture so that the resilient wire bundles now have a dog bone shape. The dog bone shape of the resilient wire bundles prevents the resilient wire bundles from being partially or totally dislodged during handling and transit. However, one or more of the shaping dies may insufficiently deform the resilient wire bundles and thereby fail to prevent same from being dislodged. Also, the shaping dies may inconsistently deform the resilient wire bundles (i.e., some shaping dies will under-penetrate the resilient wire bundles while other shaping dies will over-penetrate). The resulting unequal resilient wire bundle height increases the likelihood that one or more open circuits will occur when the resilient wire bundles are compressed between two electronic substrates. In this case, the interposer that contains the resilient wire bundles of unequal height must be replaced for the two electronic substrates to be properly connected.

Another problem with electrical connectors that incorporate resilient wire bundles is that the strands of the resilient wire bundles are not very robust. For example, the strands of resilient wire bundles are prone to spreading or "mushrooming" upon repeated insertions. If a resilient wire bundle is sufficiently mushroomed, an open circuit or near-open circuit will result when the mushroomed resilient wire bundle is subsequently compressed between two electronic substrates. This occurs because mushrooming can undesirably limit the compressive force on the resilient wire bundle and thereby increase electrical resistance through the resilient wire bundle to the point where an open circuit or near-open circuit is created. In this case, the interposer that contains the mushroomed resilient wire bundle must be replaced for the two electronic substrates to be properly connected. Moreover, the strands of resilient wire bundles can snag on mating features during insertion and withdrawals. If either a snagged strand of a resilient wire bundle or a mushroomed resilient wire bundle subsequently makes contact with an adjacent resilient wire bundle or an adjacent contact on the electronic substrate, a short circuit will result. Such a short can catastrophically damage to one or both of the electronic substrates being interconnected. Accordingly, the interposer that contains the snagged strand or mushroomed resilient wire bundle, and possibly also one or both of the electronic substrates being interconnected, would have to be replaced.

It should therefore be apparent that a need exists for an enhanced mechanism for connecting two substrates using resilient wire bundles.

SUMMARY OF THE INVENTION

According to the preferred embodiments of the present invention, two substrates are electrically connected using resilient wire bundles captured in apertures of an interposer by a retention member. The interposer comprises an electrically non-conductive carrier having two surfaces and apertures extending from surface to surface. A resilient wire bundle is disposed in each aperture. An electrically non-conductive retention member, such as a thin polyimide film, is associated with one or both surfaces of the carrier and has an orifice overlying each aperture. The width of each orifice is smaller than that of the underlying aperture to thereby enhance retention of the resilient wire bundle within the aperture. Pin contacts of one or both of the substrates make electrical contact with the resilient wire bundles by extending through the orifices of the retention member and partially through the apertures. In one embodiment of the present invention, the interposer is a land grid array (LGA) connector that connects an electronic module and a printed circuit board (PCB).

The foregoing and other features and advantages of the present invention will be apparent from the following more particular description of the preferred embodiments of the present invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements.

DETAILED DESCRIPTION OF THE PREFERRED EMBODIMENTS

1.0 Overview

In accordance with the preferred embodiments of the present invention, two substrates are electrically connected using resilient wire bundles captured in apertures of an interposer by a retention member. The interposer comprises an electrically non-conductive carrier having two surfaces and apertures extending from surface to surface. A resilient wire bundle is disposed in each aperture. An electrically non-conductive retention member, such as a thin polyimide film, is associated with one or both surfaces of the carrier and has an orifice overlying each aperture. The width of each orifice is smaller than that of the underlying aperture to thereby enhance retention of the resilient wire bundle within the aperture. Pin contacts of one or both of the substrates make electrical contact with the resilient wire bundles by extending through the orifices of the retention member and partially through the apertures. In one embodiment of the present invention, the interposer is a land grid array connector that connects an electronic module and a printed circuit board.

2.0 Detailed Description

Figure 1:
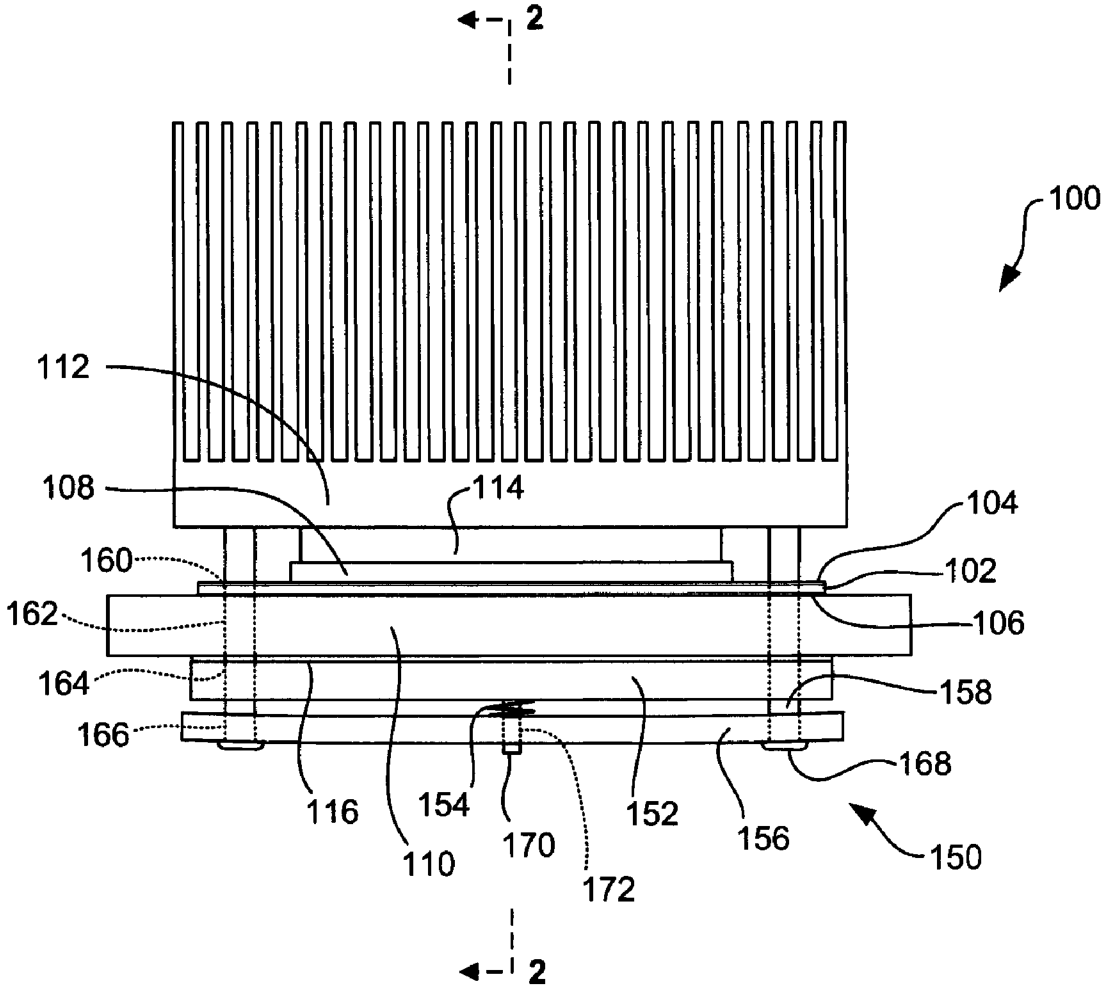
FIG. 1 is a side perspective view of a circuit card assembly having an interposer that incorporates a retention member according to the preferred embodiments of the present invention.

With reference to the figures and in particular FIG. 1, there is depicted, in a side perspective view, a circuit card assembly 100 having an interposer 102 that incorporates one or more retention members, such as thin polymer films 104, 106, in accordance with the preferred embodiments of the present invention. In circuit card assembly 100, interposer 102 is sandwiched between a ceramic module substrate 108 and a printed circuit board (PCB) 110. Although the preferred embodiments of the present invention are described herein within the context of a land grid array (LGA) connector that connects an electronic module to a PCB, one skilled in the art will appreciate that many variations are possible within the scope of the present invention. For example, the present invention may be utilized in connecting any two substrates, such as connecting a ribbon substrate to any of a PCB, an electronic module, or another ribbon substrate.

A rectilinear heat sink 112 is connected to a bare die or module cap 114, which is in turn connected to ceramic module substrate 108. Heat sink 112 provides heat transfer functions, as is well known in the art. Electronic components, such a microprocessors and integrated circuits, must operate within certain specified temperature ranges to perform efficiently. Excessive heat degrades electronic component performance, reliability, life expectancy, and can even cause failure. Heat sinks, such as rectilinear heat sink 112, are widely used for controlling excessive heat. Typically, heat sinks are formed with fins, pins or other similar structures to increase the surface area of the heat sink and thereby enhance heat dissipation as air passes over the heat sink. In addition, it is not uncommon for heat sinks to contain high performance structures, such as vapor chambers and/or heat pipes, to further enhance heat transfer. Heat sinks are typically formed of metals, such as copper or aluminum. The use of a heat sink, per se, is not necessary for purposes of the present invention, but is important in understanding an environment in which the present invention may be used.

Electronic components are generally packaged using electronic packages (i.e., modules) that include a module substrate, such as ceramic module substrate 108, to which the electronic component is electronically connected. In some cases, the module includes a cap (i.e., capped modules) which seals the electronic component within the module. In other cases, the module does not include a cap (i.e., a bare die module). In the case of a capped module, a heat sink is typically attached with a thermal interface between a bottom surface of the heat sink and a top surface of the cap, and another thermal interface between a bottom surface of the cap and a top surface of the electronic component. In the case of a bare die module, a heat sink is typically attached with a thermal interface between a bottom surface of the heat sink and a top surface of the electronic component.

Referring again to FIG. 1, a rigid insulator 116 is disposed along the bottom surface of PCB 110 and is preferably fabricated from fiberglass reinforced epoxy resin. Rigid insulator 116 is urged upwards against PCB 110, and PCB 110 is thereby urged upward towards interposer 102 and module substrate 108, by a clamping mechanism. Preferably, the clamping mechanism is a post/spring-plate type clamping mechanism 150 as shown in FIG. 1. Because such clamping mechanisms are conventional, the post/spring-plate type clamping mechanism 150 is only briefly described below. Additional details about post/spring-plate type clamping mechanisms may be found in U.S. Pat. No. 6,386,890 to Bhatt et al., the disclosure of which is incorporated by reference herein. One skilled in the art will appreciate that any of the many different types and configurations of clamping mechanisms known in the art may be used in lieu of the post/spring-plate type clamping mechanism 150 shown in FIG. 1.

In the embodiment shown in FIG. 1, clamping mechanism 150 includes a stiffener 152, which is preferably a metal or steel plate. An upward force is generated by a spring 154, which directs force upward against stiffener 152 through interaction with a spring-plate 156. It is preferred that spring-plate 156 is a square structure with about the same overall footprint depth as heat sink 112. Four cylindrical posts 158 are connected at the four corners of rectilinear heat sink 112 and disposed through cylindrical interposer post apertures 160, PCB post apertures 162, post apertures in insulator 116, stiffener post apertures 164, and spring-plate post apertures 166. Post mushroom heads 168 are formed at the ends of posts 158. The post mushroom heads 168 rest against spring-plate 156 and thereby prevent spring-plate 156 from moving downward. Downward expansion or deflection forces from spring 154 are exerted directly upon spring-plate 156, which translates the forces through posts 158, heat sink 112, bare die or module cap 114 into module substrate 108, thereby forcing module substrate 108 downward until module substrate 108 comes into contact with and exerts force upon stops (not shown in FIG. 1) of interposer 102. Similarly, force from spring 154 is also exerted upwards by spring 154 and translated through stiffener 152 and insulator 116 into PCB 110, forcing PCB 110 upwards until PCB 110 comes into contact with and exerts force upon stops (not shown in FIG. 1) of interposer 102. Accordingly, PCB 110 and module substrate 108 are forced toward each other with compressive forces upon interposer 102 disposed therebetween.

Spring-plate 156 also has a threaded screw 170 in the center of spring 154. When screw 170 is turned clockwise, its threads travel along corresponding thread grooves in a spring-plate screw aperture 172 in spring-plate 156 and, accordingly, screw 170 moves upward toward and against stiffener 152. As screw 170 engages stiffener 152 and exerts force upward against it, corresponding relational force is exerted by the threads of screw 170 downward against the thread grooves in spring-plate 156. As illustrated above in the discussion of spring 154, the downward force exerted by screw 170 is translated by spring-plate 156, post mushroom heads 168, posts 158, heat sink 112 and the bare die or module cap 114 into module substrate 108, thereby forcing module substrate 108 downward until module substrate 108 comes into contact with and exerts force against stops (not shown in FIG. 1) of interposer 102. Similarly, upward force from screw 170 is translated through stiffener 152 and insulator 116 into PCB 110, forcing PCB 110 upwards until PCB 110 comes into contact with and exerts force against stops (not shown in FIG. 1) of interposer 102. Accordingly, after screw 170 is rotated clockwise into contact with stiffener 152, additional clockwise rotation of screw 170 results in increasing compressive force exerted by PCB 110 and module substrate 108 upon interposer 102 disposed therebetween.

Figure 2:
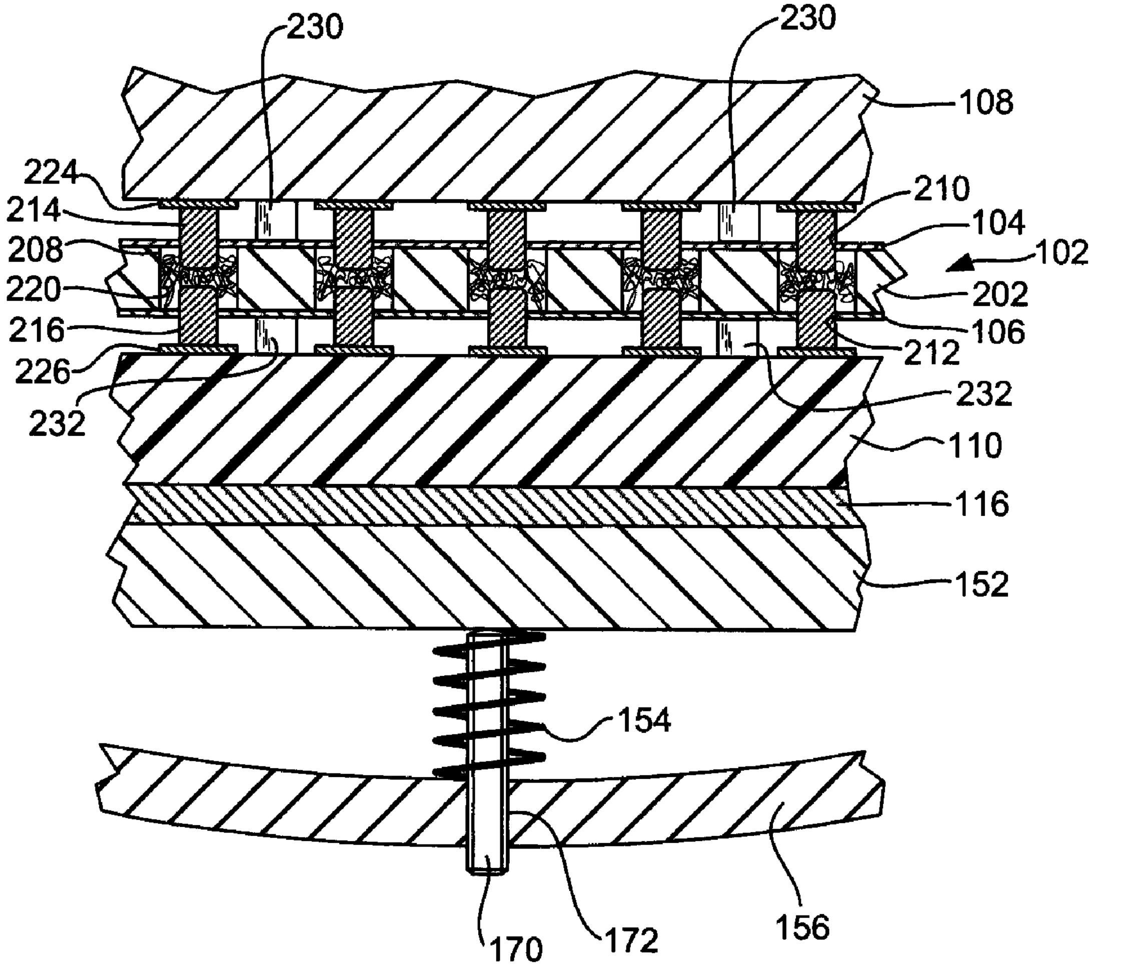
FIG. 2 is a partial, sectional view of the circuit card assembly of FIG. 1, taken along the section line indicated in FIG. 1.
Figure 3:
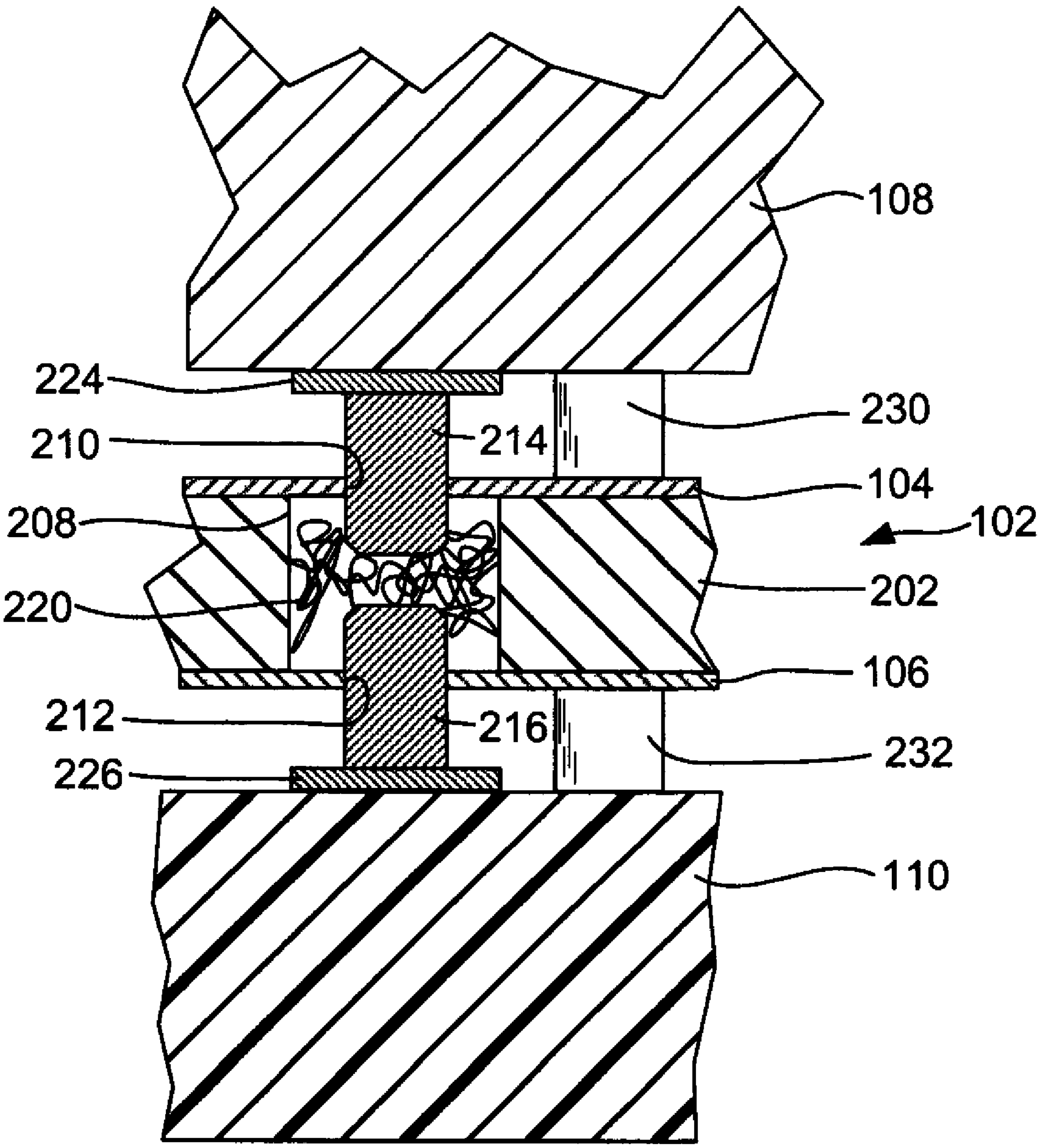
FIG. 3 is an enlarged partial, sectional view of the circuit card assembly of FIG. 2, in an area of a single aperture of the interposer.
Figure 4:
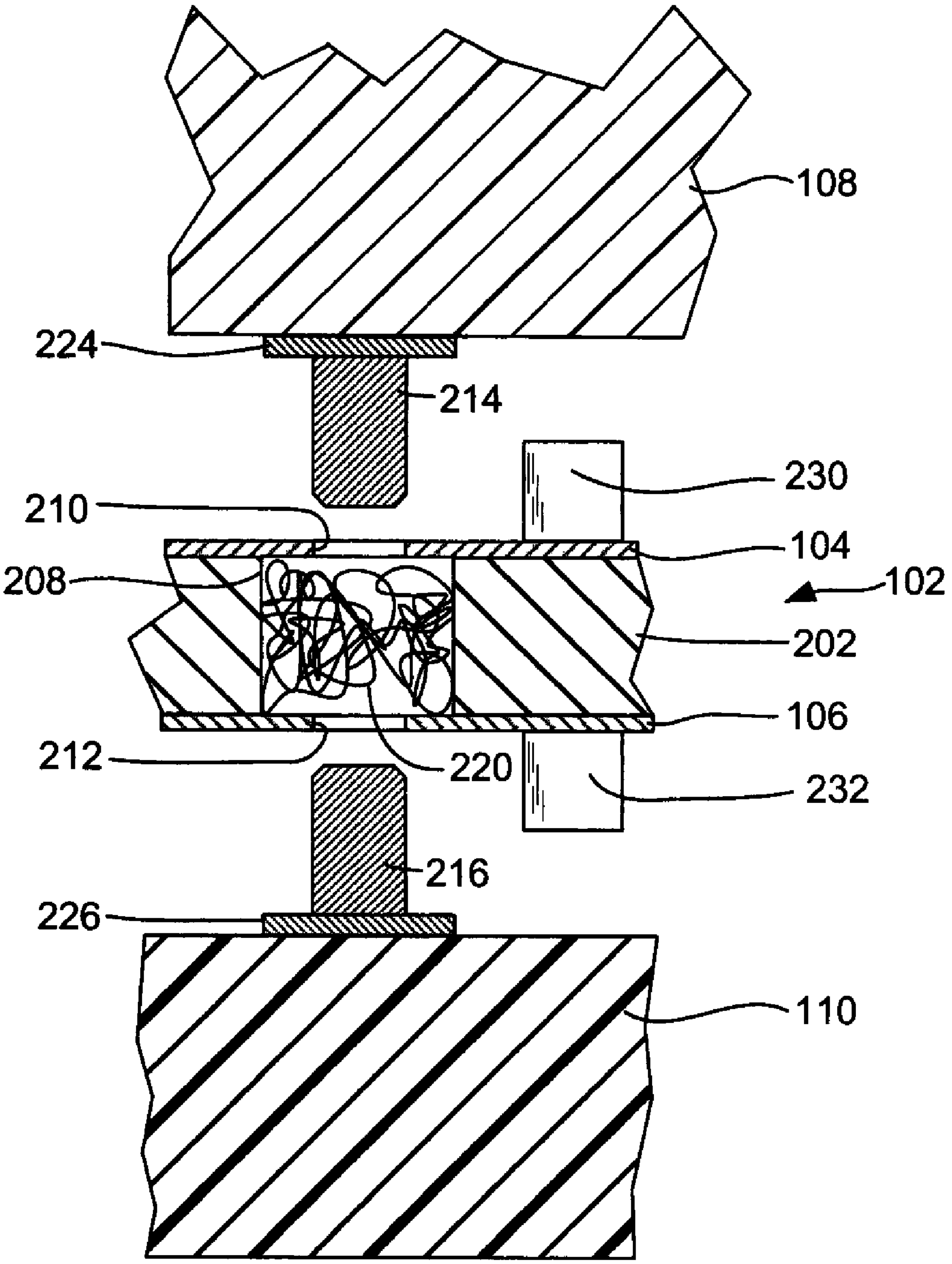
FIG. 4 is an unassembled version of the enlarged partial, sectional view of the circuit card assembly shown in FIG. 3.

Reference is now made to FIGS. 2-4. FIG. 2 illustrates, in a partial, sectional view, circuit of card assembly 100 along the section line 2-2 of FIG. 1. More particularly, FIG. 2 shows a portion of a land grid array (LGA) site comprising pin contacts of PCB 110 and corresponding pin contacts of module substrate 108. As discussed in detail below, these pin contacts make electrical contact with each other through resilient wire bundles captured in apertures of interposer 102 by retention members. FIG. 3 illustrates, in an enlarged partial, sectional view, circuit card assembly 100 in an area of a single aperture of interposer 102. FIG. 4 is an unassembled version of FIG. 3. That is, FIG. 4 illustrates, in an enlarged partial, sectional view, circuit card 100 in an area of a single aperture of interposer 102 in an unassembled state.

According to the preferred embodiments of the present invention, interposer 102 includes an electrically non-conductive carrier 202 and one or more electrically non-conductive retention members 104, 106. The construction of carrier 202 is conventional, and thus only briefly described herein. Additional details about the construction of such carriers may be found in U.S. Pat. No. 6,062,870 to Hopfer, III et al., the disclosure of which was already incorporated by reference herein. Preferably, carrier 202 is molded or machined with apertures 208. For example, carrier 202 may be formed by injection molding of suitable electrically non-conductive materials. Those materials should have good flow characteristics at molding temperatures to assure formation of the fine detail required for the small aperture configurations, particularly when molding a thin carrier 202. The mold typically includes core pins that when withdrawn define apertures 208. Specific examples of suitable moldable materials include polyesters, such as the thermoplastic polyester resin product sold by E.I. DuPont de Nemours & Co., Inc. under the tradename Rynite and liquid crystal polymers such as the product sold by Hoechst Celanese Corporation under the tradename Vectra. Smooth inner wall surfaces of apertures 208 are assured by a molding process, even when glass fiber fillers are included to enhance the stability of the final interposer product.

Carrier 202 may alternatively be fabricated by machining apertures 208 into a solid sheet or board. Each aperture 208 is bored completely through carrier 202 so that it extends form surface to surface with a desired diameter. Forming apertures 208 by such machining usually is more economical for short production runs. However, more care is required to secure smooth inner wall surfaces in apertures 208. Also, use of glass fiber fillers in carrier 202 preferably is avoided when apertures 208 are to be machined as the imbedded fibers tend to result in rough inner wall surfaces in apertures formed by machining. Rough inner wall surfaces can catch individual strands of wire which may interfere with the desired resilient operation of the resilient wire bundles.

Retention members 104, 106 are preferably machined with orifices 210, 212. For example, retention members 104, 106 may be fabricated by machining orifices 210, 212 into a solid film, sheet or board of suitably electrically non-conductive materials. Those materials should have good resilience to avoid wear as contact pins are inserted into and withdrawn from orifices 210, 212, as discussed in detail below. In addition, those materials should have characteristics (e.g., coefficient of thermal expansion) compatible with carrier 202, on which retention members 104, 106 are mounted. Specific examples of suitable materials include thin polymer films, such as the polyimide product sold by E.I. DuPont de Nemours & Co., Inc. under the tradename Kapton. Each orifice 210, 212 is bored completely through retention member 104, 106 so that it extends form surface to surface with a desired diameter.

Alternatively, retention members 104, 106 may be molded with orifices 210, 212 alone or together with carrier 202 as a one-piece unit. For example, retention members 104, 106 may be formed by injection molding of suitable electrically non-conductive materials. In addition to having good resilience and compatible characteristics as discussed above, those materials should have good flow characteristics at molding temperatures to assure formation of the fine detail required for the small orifice configurations.

Figure 6:
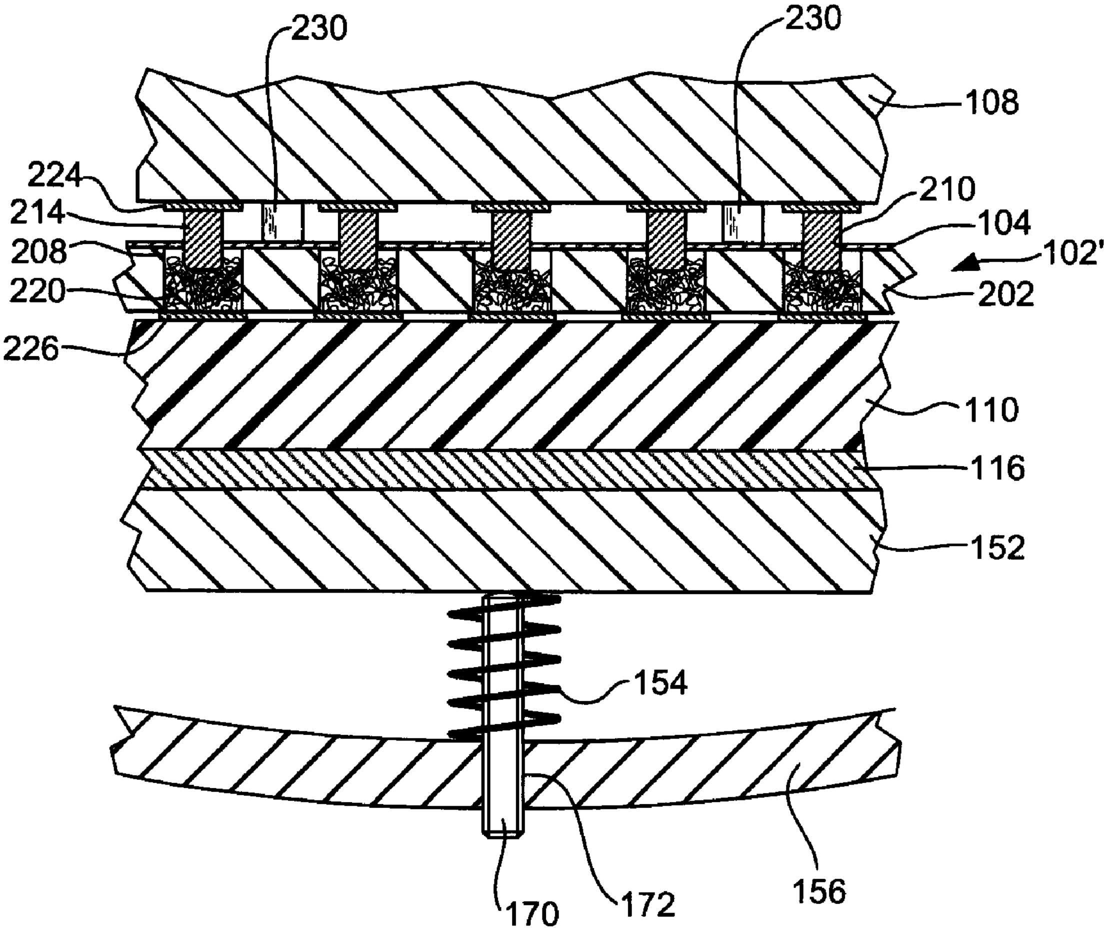
FIG. 6 is a partial, sectional view of a circuit card assembly having a hybrid interposer that incorporates a retention member according to the preferred embodiments of the present invention.

Inserted within each aperture 208 of carrier 202 is a resilient wire bundle 220. Such resilient wire bundles are also well known as wadded wire, fuzz buttons, button contacts, button wads, or contact wads, which are collectively referred to herein as resilient wire bundles. For example, U.S. Pat. No. 6,062,870 to Hopfer, III et al., the disclosure of which was already incorporated by reference herein, discloses an electrical interconnect that incorporates resilient wire bundles that are retained in holes in a carrier by compressive friction engagement with a central section of the side wall of each of the holes. As shown in FIGS. 2-4, the top end of each resilient wire bundle 220 mates with a pin contact 214 of module substrate 108 and the bottom end of each resilient wire bundle 220 mates with a pin contact 216 of PCB 110. Alternatively, the interposer may be of a hybrid-type, wherein contact pins are incorporated in only one of the substrates, i.e., either the module substrate 108 or the PCB 110. For example, as shown in FIG. 6, the top end of each resilient wire bundle 220 mates with a pin contact 214 of substrate module 108 while the bottom end of each resilient wire bundle 220 mates with a pad contact 226.

According to the preferred embodiments of the present invention, the width of each orifice 210, 212 of retention members 104, 106 is smaller than that of aperture 208 to thereby enhance retention of the resilient wire bundle 220 within aperture 208.

The upper end of each resilient wire bundle 220 is captured within aperture 208 by an annular ledge formed where retention member 104 overhangs aperture 208, while the bottom end of each resilient wire bundle 220 is captured within aperture 208 by an annular ledge formed where retention member 106 projects under aperture 208. Preferably, the ledges retain physical contact with resilient wire bundles 220 in a manner that is not a press-fit, but which prevents resilient wire bundles 220 from rotating. Accordingly, resilient wire bundles 220 preferably have relaxed (non-stressed) diameters and heights approximately equal to those of apertures 208.

These ledges substantially prevent any strand of resilient wire bundle 220 from escaping aperture 208, and therefore the possibility of shorting is much lower than in conventional button boards (wherein the resilient wire bundles are retained solely by compressive friction engagement with the side wall of the aperture). Preferably, there is a slight interference between the ledges and pin contacts 214, 216 (i.e., the diameter of pin contacts is slightly larger than that of orifices 210, 212 of retention members 104, 106) so that upon withdrawal of pin contacts 214, 216 from apertures 208 the ledges act as "wiper blades" to scrape any snagged strands of resilient wire bundles 220 off the pin contacts 214, 216. However, it may be desirable to dimension pin contacts 214, 216 and orifices 210, 212 to avoid this slight interference in certain applications, such as when insertion force is to be minimized.

In addition, the ledges protect the resilient wire bundles 220 and prevent resilient wire bundles 220 from being jarred completely or partially loose from interposer 102. Moreover, resilient wire bundles 220 will not mushroom because the ledges prevent the resilient wire bundles 220 from escaping the confines of apertures 208.

Resilient wire bundles are typically formed from a single strand of metal wire, which is preferably plated with a precious metal such as gold. Resilient wire bundles typically have a wire diameter in the range of approximately 0.002 inch. Preferably, resilient wire bundles 220 are formed from a single strand of gold plated beryllium copper wire having a wire diameter in the range of approximately 0.002 inch. Each strand is preferably wadded together in a random orientation to form a generally cylindrical "button" of wadded wire. Generally, it is preferable that a precious metal wire having a random orientation be used for resilient wire bundle 220 to provide multiple contact points on pin contacts 214, 216 (as best seen in FIG. 3), increasing the reliability of the overall electrical interconnection by providing multiple hertzian or high localized stress contacts. Suitable resilient wire bundles are exemplified by, but not limited to, resilient wire bundle products sold by Cinch Connectors, Lombard, Ill. under the tradename CIN::APSE and Tecknit, Inc., Cranford, N.J. under the tradename Fuzz Button.

Pin contacts 214 are preferably soldered to conventional electrically conductive pad contacts 224 on module substrate 108. Similarly, pin contacts 216 are preferably soldered to conventional electrically conductive pad contacts 226 on PCB 110. Pin contacts 214, 216 comprise an electrically conductive metal, such as a copper alloy, aluminum alloy, or the like. Preferably, pin contacts 214, 216 comprise a copper alloy base that is Pd—Ni plated and gold flashed. The gold-flash resides on top of the Pd—Ni plate and prevents oxidation of the underlying copper alloy base, while the gold-flash Pd—Ni plating combination allows less gold into the solder bath than traditional (thicker) gold over nickel plating (if too much gold is mixed with solder during the soldering process, gold weakens the resulting solder joint).

In general, the size and shape of pin contacts 214, 216 as well as the wire diameter of resilient wire bundles 220 can be adjusted to trade off insertion force and contact reliability. Preferably, each pin contact 214, 216 is tapered, chamfered, semi-spherical or pointed at the end thereof that makes contact with resilient wire bundle 220 so that at a given insertion force the contact stress will be large. Accordingly, the reliability of interposer 102 is likely to be greater than conventional interposers having resilient wire bundles that mate with pad contacts having a larger area of contact and consequently less contact stress at a given insertion force.

Most of the insertion force of pin contacts 214, 216 preferably goes into making multiple high localized stress contacts with resilient wire bundle 220, not compressing resilient wire bundle 220. Accordingly, insertion force can be minimized because it is used efficiently. Thus, the present invention facilitates the use of an LGA connector for connecting a bare die module to a PCB by minimizing the rated insertion and operating force. When bare die modules are used, it is desirable to minimize the rated insertion and operating force because the clamping mechanism applies this force directly through the electronic component itself.

Stops 230 set the length of penetration of pin contacts 214 of module substrate 108 into the top of apertures 208 of carrier 202. Similarly, stops 232 set the length of penetration of pin contacts 216 of PCB 110 into the bottom of apertures 208 of carrier 202. As best seen in FIG. 4, stops 230, 232 preferably project from carrier 202 through stop holes 502 (shown in FIG. 5) in the thin polymer films that form retention members 104, 106. More preferably, stops 230, 232 are integrally formed with carrier 202 as carrier 202 is formed by injection molding.

Figure 5:
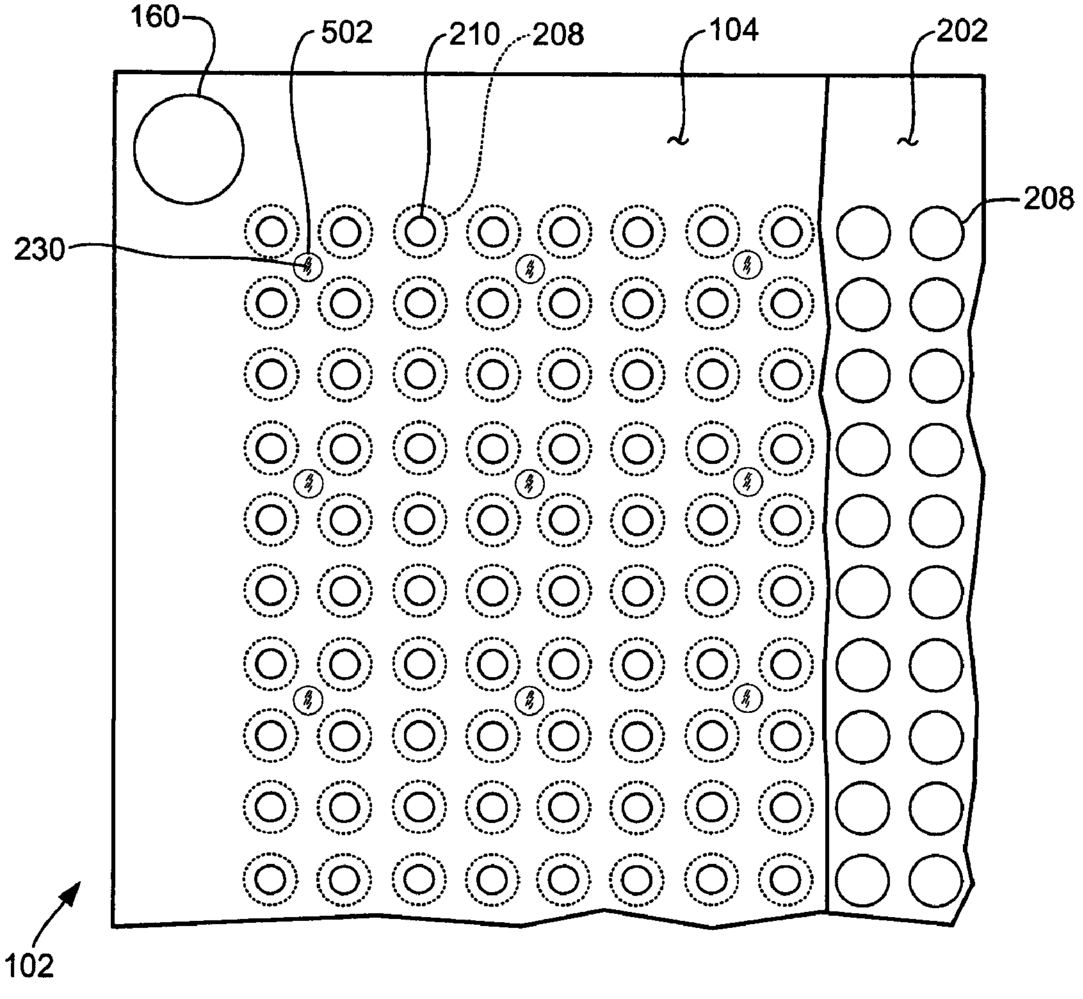
FIG. 5 is a partial, top perspective view of an interposer that incorporates a retention member according to the preferred embodiments of the present invention. The retention member is shown partially cut away to reveal a portion of an underlying carrier.

Preferably, stops 230, 232 are interspersed on both surfaces of carrier 202 in a pattern that facilitates generally uniform penetration of pin contacts 214, 216 into apertures 208. This is best seen in FIG. 5, which illustrates, in a partial, top perspective view, an interposer 102 that incorporates a retention member 104 according to the preferred embodiments of the present invention. In FIG. 5, for purposes of illustration, retention member 104 is partially cut away to reveal a portion the underlying carrier 202. As shown in FIG. 5, stops 230, 232 may be interspersed on both surfaces (only one surface is shown in FIG. 5) of carrier 202 between apertures 208. Alternatively, or in addition, stops 230, 232 may be interspersed on both surfaces of carrier 202 along the edges of interposer 102 outside the area of apertures 208. Those skilled in the art will appreciate, however, that the stops need not be present on both surfaces of carrier 202. For example, in the case of a hybrid interposer, such as hybrid interposer 102' shown in FIG. 6, the stops need only be present on a single surface of carrier 202.

Stops 230, 232 may also serve to facilitate alignment of retention members 104, 106 relative to carrier 202, i.e., the retention member 104 is aligned relative to carrier 202 so that the carrier's stops 230 will penetrate this retention member's stop holes 502, and, likewise, retention member 106 is aligned relative to carrier 202 so that the carrier's stops 230 will penetrate this retention member's stop holes. Those skilled in the art will appreciate, however, that other configurations of the stops are possible without departing from the scope of the present invention. For example, in lieu of projecting from carrier 202, the stops may project from module substrate 108 and PCB 110, or may be integrally formed with retention members 104, 106.

By way of example, and without limitation, for a carrier 202 having a thickness of in the range of approximately 0.040 inch, retention members 104, 106 comprising Kapton polyimide films would each have a thickness in the range of approximately 0.006 inch and pin contacts 224, 226 would each penetrate in the range of approximately 0.012 inch into aperture 208 in carrier 202. Also, by way of example, and without limitation, for pin contacts 224, 226 each have a diameter of in the range of approximately 0.016 inch, orifices 210, 212 in retention members 104, 106 would each have a diameter of in the range of approximately 0.015 inch and apertures 208 in carrier 202 would each have a diameter of in the range of approximately 0.025 inch. In this example, the annular ledge would be in the range of approximately 0.005 inch (i.e., (0.025-0.015)/2) and the pin contacts 224, 226 would fit into orifices 210, 212 with a slight interference in the range of approximately 0.001 inch. However, those skilled in the art will appreciate that alternative compositions, configurations and dimensions are possible without departing from the spirit and scope of the present invention. In general, the compositions, configurations and dimensions will change for different applications. For example, the dimensions will typically vary in the range of ½ to 2.5 times the approximate values provided above.

FIG. 6 illustrates, in a partial, sectional view, a circuit card assembly having a hybrid interposer 102' that incorporates a single retention member 104 according to the preferred embodiments of the present invention. Hybrid interposer 102' shown in FIG. 6 is similar to interposer 102 shown in FIG. 2, except that retention member 106 and stops 232 are omitted from the bottom surface of carrier 202. In some cases it may be desirable for one of the substrates (i.e., either PCB 110 or module substrate 108) to have conventional pad contacts rather than pin contacts. Hybrid interposer 102' addresses such a case, i.e., the case where the PCB has conventional pad contacts rather than pin contacts. As shown in FIG. 6, the bottom of each resilient wire bundle 220 makes contact with pad contacts 226 of PCB 110 in a conventional manner, such as by compression force, solder, electrically-conductive adhesive, etc. Although not shown in FIG. 6, it may be desirable to mount an additional retention member on the bottom surface of carrier 202 to enhance retention of resilient wire bundles 220 (i.e., similar to retention member 106 in FIG. 2).

Figure 7:
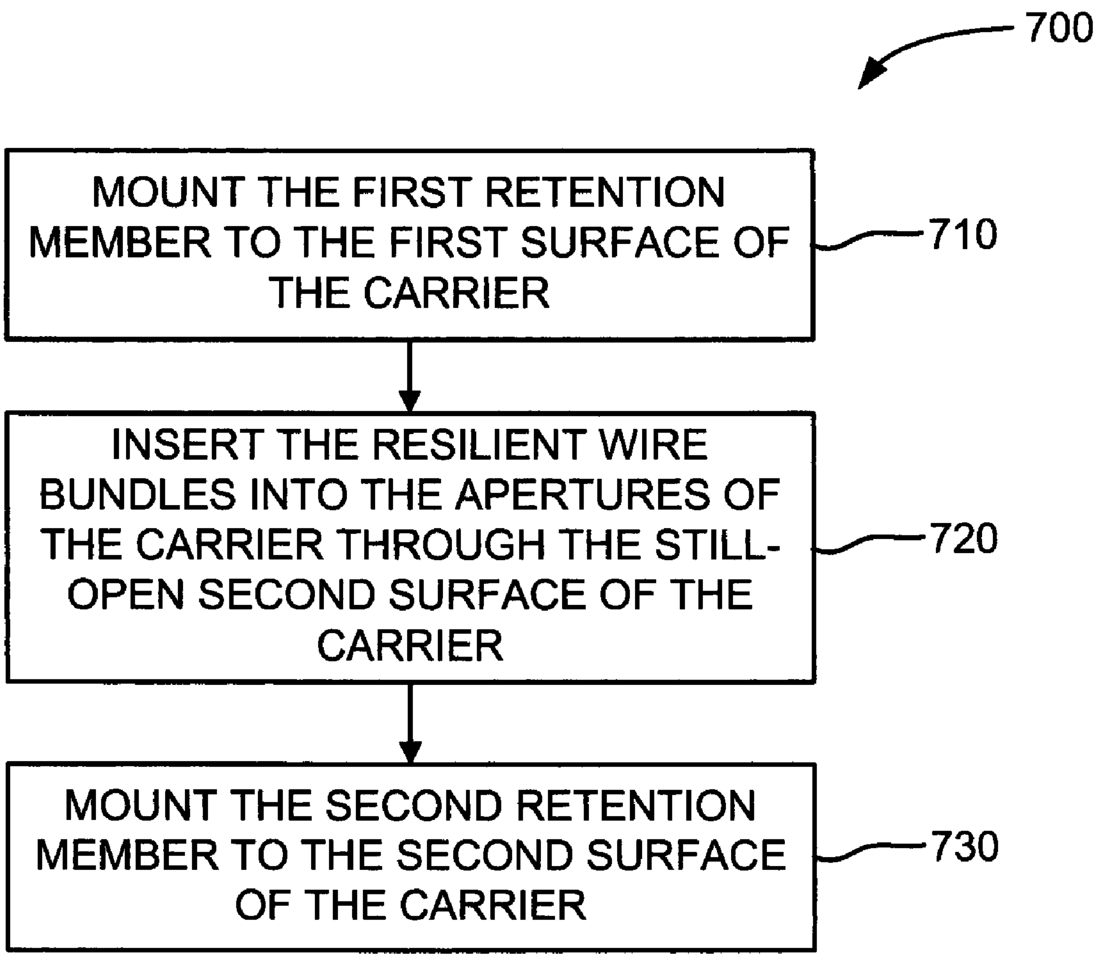
FIG. 7 is a flow diagram of a method for assembling an interposer that incorporates a retention member according to the preferred embodiments of the present invention.

FIG. 7 is a flow diagram of a method 700 for assembling an interposer that incorporates a retention member according to the preferred embodiments of the present invention. Method 700 sets forth the preferred order of the steps. It must be understood, however, that the various steps may occur at any time relative to one another. A first retention member having orifices therein is mounted on a first surface of the carrier having apertures therein (step 710). This step may be facilitated by aligning and inserting stops of the carrier into stop holes of the first retention member. Preferably, the first retention member is attached to the first surface of the carrier through the use of a conventional fastening mechanism, such as adhesive, thermal welding, or the like. Next, resilient wire bundles are inserted in the apertures of the carrier from the still-open second surface of the carrier (step 720). A second retention member having orifices therein is then mounted on the second surface of the carrier (step 730). This step may be facilitated by aligning and inserting stops of the carrier into stop holes of the second retention member. Preferably, the second retention member is attached to the second surface of the carrier through the use of a conventional fastening mechanism, such as adhesive, thermal welding, or the like.

One skilled in the art will appreciate that many variations are possible within the scope of the present invention. For example, although the preferred embodiments of the present invention are described herein within the context of a land grid array (LGA) connector that connects an electronic module to a PCB, the present invention may be utilized in connecting any two substrates, such as connecting a ribbon substrate to any of a PCB, an electronic module, or another ribbon substrate. Moreover, different types and configurations of clamping mechanisms known in the art may be used to force the substrates together in lieu of the post/spring-plate type clamping mechanism described herein. Also, although the dimensions of the pin contacts, apertures of the carrier, and orifices of the retention members are set forth as diameters, these features need not be round. Thus, while the present invention has been particularly shown and described with reference to the preferred embodiments thereof, it will be understood by those skilled in the art that these and other changes in form and detail may be made therein without departing from the spirit and scope of the present invention.

What is claimed is:

1. A method for assembling an interposer, comprising the steps of:

providing an electrically non-conductive carrier having a first surface and a second surface, a plurality of apertures extending from the first surface to the second surface, and a stop member projecting from the first surface;

providing an electrically non-conductive first retention member having a plurality of orifices each positioned for registration with a corresponding one of the apertures of the carrier, wherein each orifice of the first retention member has a width smaller than that of the corresponding aperture of the carrier;

aligning the first retention member over the first surface of the carrier so that the orifices of the first retention member are positioned above the apertures of the carrier;

inserting the stop member of the carrier through a hole in the first retention member;

attaching the first retention member to the first surface of the carrier after the step of aligning the first retention member over the first surface of the carrier;

inserting resilient wire bundles into the apertures of the carrier.

2. The method as recited in claim 1, wherein the first retention member comprises a thin polymer film.

3. The method as recited in claim 1, wherein the first retention member comprises a polyimide film.

4. The method as recited in claim 1, further comprising the steps of:

providing an electrically non-conductive second retention member having a plurality of orifices each positioned for registration with a corresponding one of the apertures of the carrier, wherein each orifice of the second retention member has a width smaller than that of the corresponding aperture of the carrier;

aligning the second retention member over the second surface of the carrier so that the orifices of the second retention member are positioned above the apertures of the carrier, wherein the step of aligning the second retention member over second surface of the carrier occurs after the step of inserting resilient wire bundles into the apertures of the carrier;

attaching the second retention member to the second surface of the carrier after the step of aligning the second retention member over the second surface of the carrier.

5. The method as recited in claim 1, further comprising the steps of:

providing a printed circuit board (PCB) having a plurality of contacts each positioned for registration with a corresponding one of the apertures of the carrier;

positioning the PCB under the second surface of the carrier and aligning the PCB and the carrier so that the contacts of the PCB are position below the apertures of the carrier and so that the contacts of the PCB make electrical contact with the resilient wire bundles.

6. A method for assembling an interposer, comprising the steps of:

providing an electrically non-conductive carrier having a first surface and a second surface, a plurality of apertures extending from the first surface to the second surface, and a stop member projecting from the first surface;

providing an electrically non-conductive first retention member comprising a thin polymer film having a plurality of orifices each positioned for registration with a corresponding one of the apertures of the carrier, wherein each orifice of the first retention member has a width smaller than that of the corresponding aperture of the carrier;

aligning the first retention member over the first surface of the carrier so that the orifices of the first retention member are positioned above the apertures of the carrier;

inserting the stop member of the carrier through a hole in the first retention member;

attaching the first retention member to the first surface of the carrier after the step of aligning the first retention member over the first surface of the carrier;

inserting resilient wire bundles into the apertures of the carrier.

7. The method as recited in claim 6, wherein the first retention member comprises a polyimide film.

8. The method as recited in claim 6, further comprising the steps of:

providing an electrically non-conductive second retention member comprising a thin polymer film having a plurality of orifices each positioned for registration with a corresponding one of the apertures of the carrier, wherein each orifice of the second retention member has a width smaller than that of the corresponding aperture of the carrier;

aligning the second retention member over the second surface of the carrier so that the orifices of the second retention member are positioned above the apertures of the carrier, wherein the step of aligning the second retention member over the second surface of the carrier occurs after the step of inserting resilient wire bundles into the apertures of the carrier;

attaching the second retention member to the second surface of the carrier after the step of aligning the second retention member over the second surface of the carrier.

9. The method as recited in claim 6, further comprising the steps of:

providing a printed circuit board (PCB) having a plurality of contacts each positioned for registration with a corresponding one of the apertures of the carrier;

positioning the PCB under the second surface of the carrier and aligning the PCB and the carrier so that the contacts of the PCB are position below the apertures of the carrier and so that the contacts of the PCB make electrical contact with the resilient wire bundles.

10. A method for assembling an interposer, comprising the steps of:

providing an interposer that includes an electrically non-conductive retention member atop an electrically non-conductive carrier, wherein the carrier includes a plurality of apertures each extending from a lower surface of the carrier to the retention member and a stop member projecting from an upper surface of the barrier, wherein the retention member includes a plurality of orifices each open to a corresponding one of the apertures of the carrier, and wherein each orifice of the retention member has a width smaller than that of the corresponding aperture of the carrier to form a ledge where the retention member overhangs the aperture;

inserting resilient wire bundles into the apertures of the carrier in a direction from the lower surface of the carrier towards the retention member, wherein each resilient wire bundle is captured within the aperture by the ledge;

wherein the step of providing an interposer comprises the steps of:

aligning the retention member over the upper surface of the carrier so that the orifices of the retention member are positioned above the apertures of the carrier;

inserting the stop member of the carrier through a hole in the retention member;

attaching the retention member to the upper surface of the carrier after the step of aligning the retention member over the upper surface of the carrier.

11. The method as recited in claim 10, wherein the retention member comprises a thin polymer film.

12. The method as recited in claim 11, wherein the thin polymer film comprises a polyimide film.

13. The method as recited in claim 10, wherein the step of providing an interposer comprises the step of molding the retention member together with the carrier as a one-piece unit.

14. The method as recited in claim 10, wherein the apertures of the carrier are substantially cylindrical and the orifices of the retention member are substantially round so as to form a substantially annular ledge where the retention member overhangs the aperture.

* * * * *